US011769699B2

(12) United States Patent
Miki

(10) Patent No.: US 11,769,699 B2
(45) Date of Patent: Sep. 26, 2023

(54) SEMICONDUCTOR MANUFACTURING APPARATUS AND SEMICONDUCTOR MANUFACTURING METHOD

(71) Applicant: Kioxia Corporation, Tokyo (JP)

(72) Inventor: Tsutomu Miki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 220 days.

(21) Appl. No.: 17/188,434

(22) Filed: Mar. 1, 2021

(65) Prior Publication Data

US 2022/0059416 A1 Feb. 24, 2022

(30) Foreign Application Priority Data

Aug. 19, 2020 (JP) .................... 2020-138861

(51) Int. Cl.
*H01L 21/67* (2006.01)
*H01L 21/66* (2006.01)

(52) U.S. Cl.
CPC ........ *H01L 22/26* (2013.01); *H01L 21/67253* (2013.01)

(58) Field of Classification Search
CPC ....................................................... H01L 22/26
See application file for complete search history.

(56) References Cited

U.S. PATENT DOCUMENTS

| | | | | |
|---|---|---|---|---|
| 5,876,265 | A | * | 3/1999 | Kojima ................. B24B 37/042 438/692 |
| 5,904,609 | A | | 5/1999 | Fukuroda |
| 8,582,122 | B2 | | 11/2013 | Kobayashi |
| 9,490,186 | B2 | | 11/2016 | Benvegnu |
| 10,553,507 | B2 | | 2/2020 | Ono |
| 2002/0076933 | A1 | * | 6/2002 | Kawamura ............. H01L 22/20 438/691 |

FOREIGN PATENT DOCUMENTS

| | | | | |
|---|---|---|---|---|
| JP | H06-320416 | A | | 11/1994 |
| JP | H09-139369 | A | | 5/1997 |
| JP | 2000031102 | A | * | 1/2000 ........... B24B 37/013 |
| JP | 2001-015467 | A | | 1/2001 |
| JP | 3189076 | B2 | | 7/2001 |
| JP | 3198525 | B2 | | 8/2001 |

(Continued)

*Primary Examiner* — Mohammad M Choudhry
(74) *Attorney, Agent, or Firm* — Foley & Lardner LLP

(57) ABSTRACT

A semiconductor manufacturing apparatus includes a sound measuring unit that measures a first polishing sound of a film formed on a wafer, a sound pressure prediction regression model generation unit that generates a first regression model for obtaining a first sound pressure prediction value of the first polishing sound, a sound pressure prediction value calculation unit that performs a first calculation of the first sound pressure prediction value by using the first regression model, a residual difference calculation unit that performs a second calculation of a first residual difference, the first residual difference being a difference between a first sound pressure actual measurement value of the first polishing sound and the first sound pressure prediction value, and an end point determination unit that determines a polishing end point of the film by using the first residual difference.

16 Claims, 4 Drawing Sheets

(56) References Cited

FOREIGN PATENT DOCUMENTS

| JP | 3292243 | B2 |   | 6/2002  |
|----|---------|----|---|---------|
| JP | 3466374 | B2 |   | 11/2003 |
| JP | 2005342841 | A | * | 12/2005 |
| JP | 5728239 | B2 |   | 6/2015  |
| JP | 2017-163100 | A |   | 9/2017  |
| JP | 6580042 | B2 |   | 9/2019  |

* cited by examiner

SEMICONDUCTOR MANUFACTURING APPARATUS AND SEMICONDUCTOR MANUFACTURING METHOD

CROSS-REFERENCE TO RELATED APPLICATION

This application is based upon and claims the benefit of priority from Japanese Patent Application No. 2020-138861, filed Aug. 19, 2020, the entire contents of which are incorporated herein by reference.

FIELD

Embodiments described herein relate generally to a semiconductor manufacturing apparatus and a semiconductor manufacturing method.

BACKGROUND

When polishing a front surface of a wafer, a polishing end point of a film is detected by a predetermined method. In a semiconductor manufacturing process, accuracy required for polishing is becoming higher and higher.

An example of related art includes JP-A-2017-163100.

DETAILED DESCRIPTION

Figure 1:
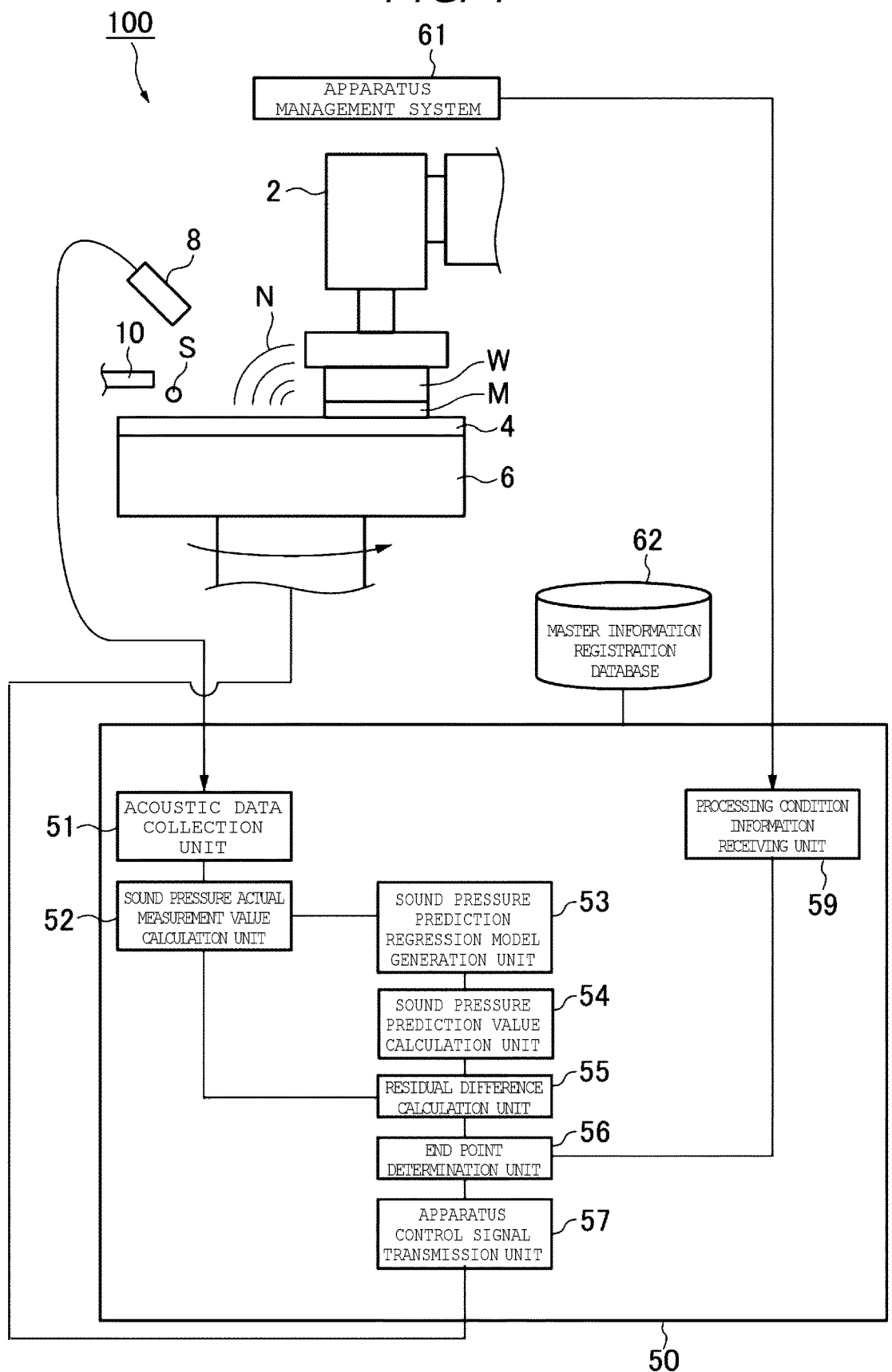
FIG. 1 is a schematic view of a main portion of a semiconductor manufacturing apparatus according to at least one embodiment.

At least one embodiment provides a semiconductor manufacturing apparatus capable of accurately determining a polishing end point.

In general, according to at least one embodiment, a semiconductor manufacturing apparatus includes a sound measuring unit that measures a first polishing sound of a film formed on a wafer, a sound pressure prediction regression model generation unit (of a controller) that generates a first regression model for obtaining a first sound pressure prediction value of the first polishing sound, a sound pressure prediction value calculation unit (of a controller) that performs a first calculation of the first sound pressure prediction value by using the first regression model, a residual difference calculation unit (of a controller) that performs a second calculation of a first residual difference, the first residual difference being a difference between a first sound pressure actual measurement value of the first polishing sound and the first sound pressure prediction value, and an end point determination unit (of a controller) that determines a polishing end point of the film by using the first residual difference.

Hereinafter, embodiments will be described with reference to the drawings. In the drawings, the same or similar portions are designated by the same or similar reference numerals.

Embodiments

In general, according to at least one embodiment, a semiconductor manufacturing apparatus includes a sound measuring unit that measures a first polishing sound of a film formed on a wafer, a sound pressure prediction regression model generation unit that generates a first regression model for obtaining a first sound pressure prediction value of the first polishing sound, a sound pressure prediction value calculation unit that performs a first calculation of the first sound pressure prediction value by using the first regression model, a residual difference calculation unit that performs a second calculation of a first residual difference which is a difference between a first sound pressure actual measurement value of the first polishing sound and the first sound pressure prediction value, and an end point determination unit that determines a polishing end point of the film by using the first residual difference.

In a semiconductor manufacturing method according to at least one embodiment, a first regression model for obtaining a first sound pressure prediction value of a first polishing sound of a film formed on a wafer is generated, a first calculation of the first sound pressure prediction value is performed by using the first regression model, the first polishing sound is measured, a second calculation of a first residual difference which is a difference between a first sound pressure actual measurement value of the first polishing sound and the first sound pressure prediction value is performed, and a polishing end point of the film is determined by using the first residual difference.

Figure 2:
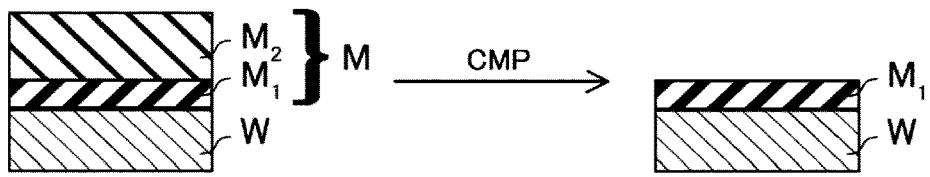
FIG. 2 is a schematic view illustrating an example of a polishing end point of a film.

FIG. 1 is a schematic view of a main portion of a semiconductor manufacturing apparatus 100 according to at least one embodiment. FIG. 2 is a schematic view illustrating an example of a polishing end point of a film.

The semiconductor manufacturing apparatus 100 includes atop ring 2, a polishing pad 4, a turntable 6, a sound measuring unit 8, a slurry supply nozzle 10, a control apparatus 50, an apparatus management system 61, and a master information registration database (storage unit) 62.

The control apparatus 50 includes an acoustic data collection unit 51, a sound pressure actual measurement value calculation unit 52, a sound pressure prediction regression model generation unit 53, a sound pressure prediction value calculation unit 54, a residual difference calculation unit 55, an end point determination unit 56, an apparatus control signal transmission unit 57, and a processing condition information receiving unit 59.

The semiconductor manufacturing apparatus 100 according to at least one embodiment includes, for example, a chemical mechanical polishing (CMP) apparatus that chemically and mechanically polishes a film M formed on a wafer W and a system that controls the CMP apparatus. A plurality of CMP apparatuses may be disposed in the semiconductor manufacturing apparatus 100 according to the embodiment.

The wafer W is, for example, a semiconductor substrate. More specifically, the wafer W is, for example, a silicon (Si) substrate. The film M is formed on a front surface of the wafer W. For example, the film M includes a film $M_1$ and a film $M_2$, as illustrated in FIG. 2. The film $M_1$ is, for example, silicon nitride film (SiN). The film $M_2$ is, for example, a tetraethyl orthosilicate (TEOS) film.

For example, the semiconductor manufacturing apparatus (CMP apparatus) 100 removes the film $M_2$ by CMP machining and exposes the film $M_1$. In this case, for example, the film $M_2$ functions as a polishing target film, and the film $M_1$ functions as a stopper film. Ideally, the semiconductor manufacturing apparatus (CMP apparatus) 100 preferably finalizes the CMP machining when removal of the film $M_2$ is completed. That is, it is preferable that an interface between the film $M_2$ as the polishing target film and the film $M_1$ as the stopper film is the polishing end point. The semiconductor manufacturing apparatus 100 and a semiconductor manufacturing method according to at least one embodiment are used for determining, for example, the polishing end point.

A configuration of the film M to which the semiconductor manufacturing apparatus 100 and the semiconductor manufacturing method according to at least one embodiment are applied is not limited to the above description. For example, material configuring the film $M_1$ and the film $M_2$ are not limited to the above description. Further, FIG. 2 illustrates that the film $M_1$ is thicker than the film $M_2$, but actual dimensions are not limited thereto. Further, FIG. 2 illustrates that the wafer W, the film $M_1$, and the film $M_2$ each have a planar shape, but actual shapes thereof are not limited thereto. For example, an interface between the wafer W and the film $M_1$ and an interface between the film $M_1$ and the film $M_2$ are not flat but may be configured to have an uneven portion. Further, another film (not illustrated) may be provided between the film $M_1$ and the wafer W.

The turntable 6 can be rotated in, for example, a horizontal plane by, for example, a motor or the like built in the turntable 6.

The polishing pad 4 is provided on the turntable 6. The polishing pad 4 is used for polishing the film M. The polishing pad 4 is formed of, for example, polyurethane. However, a material of the polishing pad 4 is not limited thereto.

The top ring 2 is provided over the polishing pad 4. For example, the wafer W is held on a lower surface of the top ring 2. The top ring 2 can be rotated in a horizontal plane by, for example, a motor or the like built in the top ring 2. Accordingly, the top ring 2 can rotate the wafer W in the horizontal plane while holding the wafer W in a state where the film M faces downward.

The sound measuring unit 8 is disposed in the vicinity of, for example, a contact surface between the polishing pad 4 and the wafer W held in the top ring 2. The sound measuring unit 8 measures a polishing sound generated during a period in which polishing (CMP machining) is performed. FIG. 1 illustrates that the polishing sound is N. The sound measuring unit 8 is, for example, a microphone. The sound measuring unit 8 can measure a sound in a frequency band, for example, greater than or equal to 10 Hz and less than 20 kHz. However, a range of frequencies of a sound that can be measured by the sound measuring unit 8 is not limited to the above-described frequencies. The sound measuring unit 8 may be configured to be able to measure, for example, a sound in a frequency band lower than 10 Hz and/or a sound in a frequency band greater than or equal to 20 kHz.

The slurry supply nozzle 10 is provided on the polishing pad 4. The slurry supply nozzle 10 supplies a slurry S used for polishing to the polishing pad 4.

The control apparatus 50, the acoustic data collection unit 51, the sound pressure actual measurement value calculation unit 52, the sound pressure prediction regression model generation unit 53, the sound pressure prediction value calculation unit 54, the residual difference calculation unit 55, the endpoint determination unit 56, the apparatus control signal transmission unit 57, the processing condition information receiving unit 59, and the apparatus management system 61 may each be configured as an electronic circuit, or may be configured by combining hardware such as a computer and software such as a program.

The master information registration database 62 is, for example, a storage device. Here, the storage device is, for example, a semiconductor memory or a hard disk. The master information registration database 62 may include one storage device or may include a plurality of storage devices. Further, the master information registration database 62 may be, for example, a server on a network. In this case, the control apparatus 50 accesses data stored in the master information registration database 62 as a server via the network by a wired connection or a wireless connection.

Figure 3:
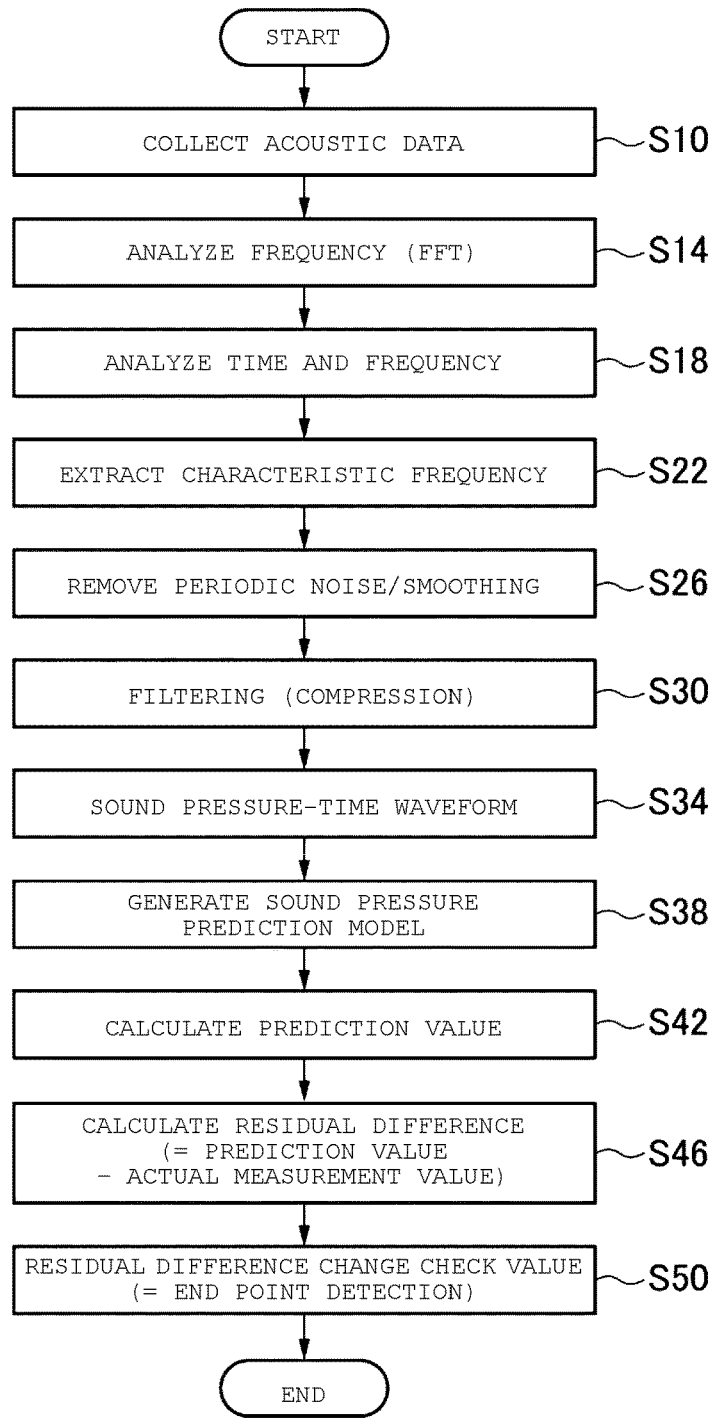
FIG. 3 is a flowchart of a semiconductor manufacturing method according to at least one embodiment.

FIG. 3 is a flowchart of the semiconductor manufacturing method according to at least one embodiment.

First, the slurry S is supplied from the slurry supply nozzle 10 to the polishing pad 4 provided on the turntable 6. Next, the turntable 6 rotates, and the top ring 2 holding the wafer W rotates. Next, when the polishing pad 4 and the turntable 6 approach, the wafer W and the polishing pad 4 are in contact with each other. Thereby, polishing of the film M formed on the front surface of the wafer W starts.

Next, the sound measuring unit 8 measures a polishing sound generated during a period in which the film M is polished. The measured polishing sound is collected by the acoustic data collection unit 51 (S10), and then sent to the sound pressure actual measurement value calculation unit 52. The sound pressure actual measurement value calculation unit 52 performs frequency analysis by using, for example, Fourier transform such as fast Fourier transform (FFT) (S14). Thereby, the sound pressure actual measurement value calculation unit 52 calculates a sound pressure actual measurement value of the polishing sound collected by the acoustic data collection unit for each frequency. Here, the "sound pressure" is a magnitude or a level (sound pressure level) of a component for each frequency. The calculation of the sound pressure actual measurement value for each frequency is performed while polishing the film M. Since the polishing of the film M progresses as time elapses, a time change of the sound pressure actual measurement value for each frequency is measured as the polishing of the film M progresses (S18). The measured sound pressure actual measurement value for each frequency may be stored in, for example, the master information registration database 62, or may be stored in another storage device not illustrated in FIG. 1.

Next, the sound pressure prediction regression model generation unit 53 selects a characteristic frequency band used for determining a polishing end point from the time change of the sound pressure actual measurement value for each frequency according to the progress of polishing of the film M (S22). The characteristic frequency band is selected based on, for example, a material configuring the film $M_1$ and the film $M_2$, dimensions of the film $M_1$ and the film $M_2$, and the film $M_1$ and the film $M_2$. However, the characteristic frequency band is not limited to the above-described factors and may be selected by considering various factors. Further, selection of the characteristic frequency band may be automatically performed by the control apparatus 50 (sound pressure prediction regression model generation unit 53) or may be performed by an operator.

Next, the sound pressure prediction regression model generation unit 53 removes a sound pressure caused by noise generated according to environment or the like in which the semiconductor manufacturing apparatus 100 is installed, performs smoothing processing with, for example, a movement average, performs filtering processing to increase an SN ratio (S26 and S30), and acquire a waveform of the time change of the sound pressure in the selected characteristic frequency band (S34). The processing is performed by, for example, the sound pressure actual measurement value calculation unit 52.

Next, the sound pressure prediction regression model generation unit 53 performs regression analysis and generates a regression model for obtaining a sound pressure prediction value of a polishing sound of the film M (S38).

Figure 4C:
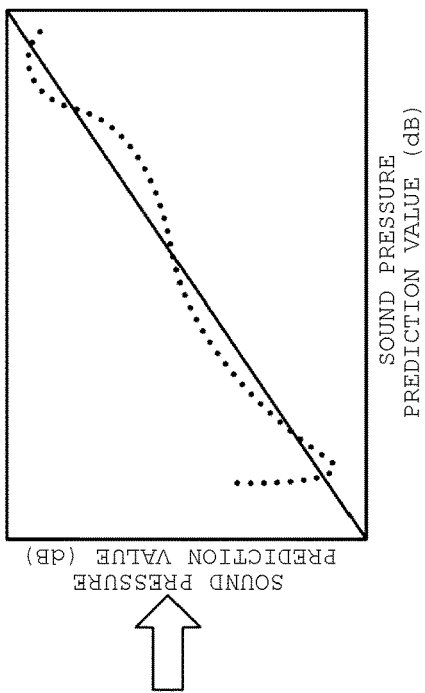
FIGS. 4A to 4C are schematic diagrams illustrating a regression model used for the semiconductor manufacturing apparatus according to at least one embodiment.
Figure 4B:
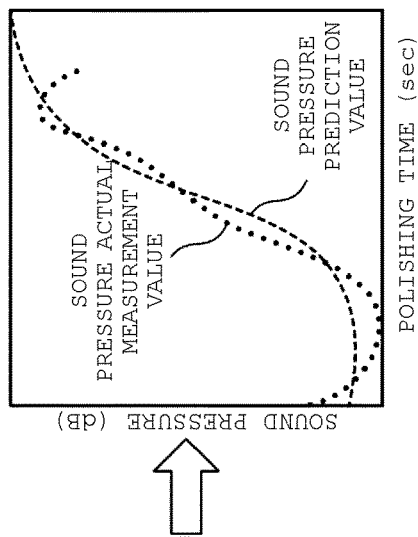
Figure 4A:
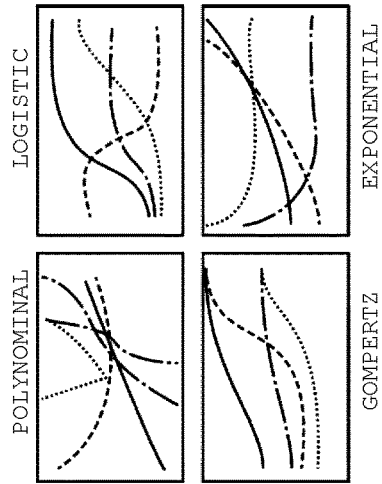

FIGS. 4A to 4C are schematic diagrams illustrating a regression model used for the semiconductor manufacturing apparatus 100 according to at least one embodiment. The regression model includes, for example, a regression model using a polynominal, a regression model using a logistic curve, a regression model using a Gompertz curve, and a regression model using an exponential function, and so on, as illustrated in FIG. 4A. The above-described regression model is stored in, for example, the master information registration database 62. Of course, the regression model that may be used in the semiconductor manufacturing apparatus according to at least one embodiment is not limited to the above-described regression model.

The sound pressure prediction regression model generation unit 53 performs the regression analysis by using at least one of the regression models stored in the master information registration database 62, for example, for the sound pressure actual measurement value calculated by the sound pressure actual measurement value calculation unit 52. The sound pressure prediction regression model generation unit 53 determines a preferable coefficient for predicting the calculated sound pressure data, for example, in the used regression model.

Next, the sound pressure prediction value calculation unit 54 calculates a sound pressure prediction value by using the above-described regression model and the determined coefficient (S42). FIG. 4B illustrates an example of the sound pressure prediction value and an example of the sound pressure actual measurement value for a passage of polishing time. Further, FIG. 4C illustrates a graph in which an example of the sound pressure actual measurement value is plotted on a vertical axis and an example of the sound pressure prediction value corresponding to each sound pressure actual measurement value is plotted on a horizontal axis. In FIG. 4C, a drawn straight line is a straight line when the sound pressure actual measurement value and the sound pressure prediction value are assumed to be equal. When many sound pressure actual measurement values can be fitted well on the straight line, it can be considered that a sound pressure can be predicted well by the regression model.

Next, the residual difference calculation unit 55 calculates a residual difference which is a difference between the sound pressure actual measurement value and the sound pressure prediction value (S46).

Next, the end point determination unit 56 determines a polishing end point of the film M by using a residual difference calculated by the residual difference calculation unit 55.

When it is determined that the polishing end point is reached, for example, the control apparatus 50 stops the polishing processing. Then, acoustic data collection is finalized. Meanwhile, when it is determined that the polishing end point is not reached, the semiconductor manufacturing apparatus 100 continuously performs polishing of the film M until it is determined that the polishing end point is reached.

The above-described operation may be automatically controlled by, for example, the control apparatus 50 (apparatus control signal transmission unit 57) or may be controlled by an operator. Further, information on a polishing type process is transmitted from, for example, the apparatus management system 61 to the processing condition information receiving unit 59 and is appropriately used in the control apparatus 50.

When the film M formed on the next wafer is polished after it is determined that the polishing end point of the film M is reached (when the CMP machining is performed under substantially the same conditions), the previously obtained regression model and the determined coefficient may be used. However, after the polishing sound is measured by the sound measuring unit 8 again, the regression model may be selected, and the coefficient may be determined again. That is, the sound pressure prediction regression model generation unit 53 may generate a regression model for each wafer to be polished (for each CMP machining). Here, a regression model different for each wafer may be used as the regression model to be generated for each wafer. Further, the same regression model (for example, a regression model using a Gompertz curve) may have different coefficients.

Figure 5A:
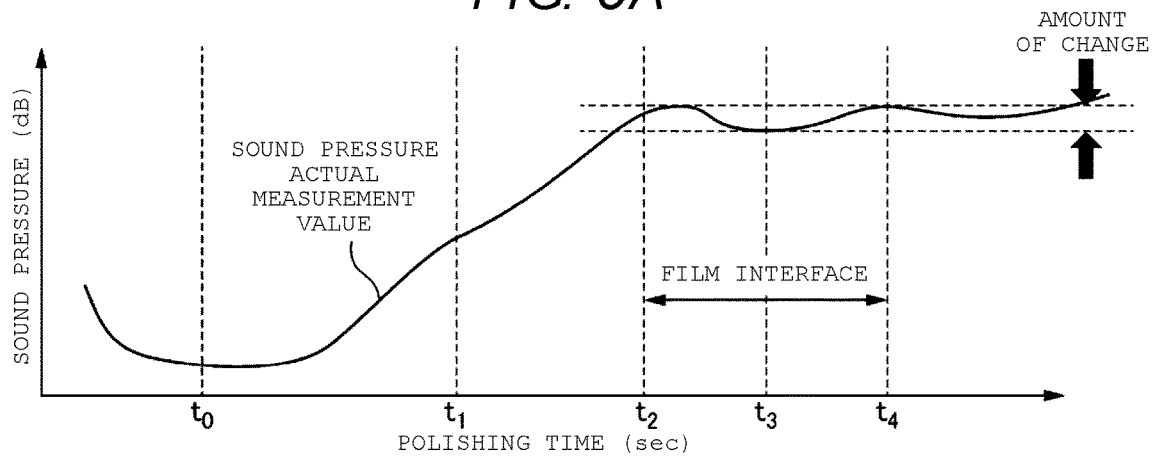
FIGS. 5A to 5C are schematic diagrams illustrating end point detection performed by the semiconductor manufacturing apparatus according to at least one embodiment.
Figure 5B:
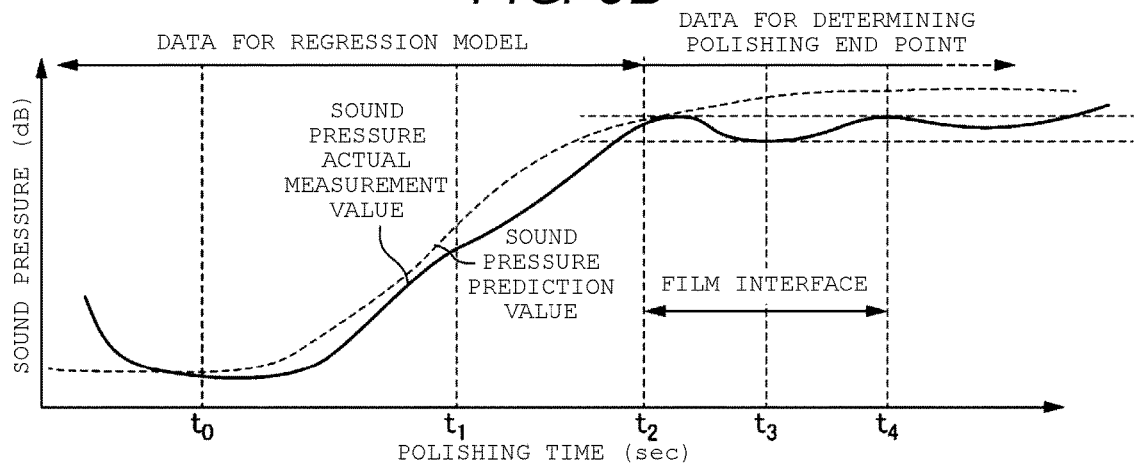
Figure 5C:
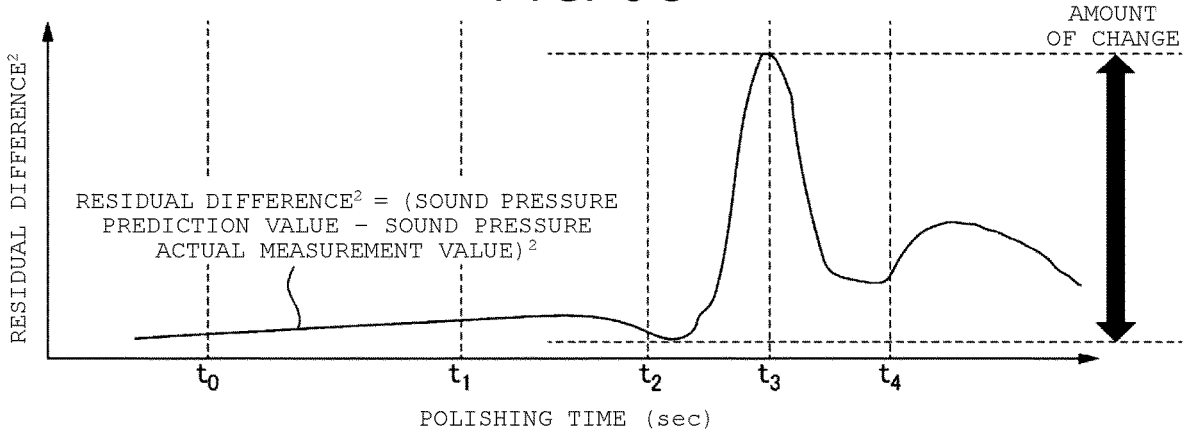

FIGS. 5A to 5C are schematic diagrams illustrating a semiconductor manufacturing method according to at least one embodiment. FIG. 5A is a schematic diagram illustrating a method of determining a polishing end point of a film in a semiconductor manufacturing method as a comparative form. FIG. 5A illustrates a graph in which a vertical axis represents a sound pressure actual measurement value and a horizontal axis represents polishing time.

In the graph illustrated in FIG. 5A, a sound pressure actual measurement value increases almost in a monotonic manner from near time $t_0$ with a passage of the polishing time. The sound pressure actual measurement value decreases from near time $t_2$ with the passage of the polishing time. Then, the sound pressure actual measurement value becomes a minimum value (local minimum) near time $t_3$. The sound pressure actual measurement value increases from near time $t_3$ to near time $t_4$ with the passage of the polishing time.

The time $t_0$ is, for example, time set to exclude the sound pressure actual measurement value immediately after the start of polishing, from the processing. The time $t_0$ may not be set.

The time $t_3$ is calculated from, for example, a thickness of the film $M_2$ to be polished and a polishing rate to be set by the semiconductor manufacturing apparatus 100, is a time corresponding to a film interface between the film $M_2$ and the film $M_1$, and is a theoretical polishing endpoint. In contrast to this, in order to consider fluctuation in polishing progress caused by materials, dimensions, uneven portion shapes, and so on of the film $M_1$ and the film $M_2$, a time zone (predetermined time zone or period) corresponding to a region (predetermined region) including a film interface is defined. The time $t_2$ is time on an earlier side in a predetermined time zone, and the time $t_4$ is time on a later side in the predetermined time zone.

For example, polishing of the film $M_2$ is performed between time $t_2$ and the time $t_4$, and thereby, both the film $M_2$ and the film $M_1$ can be considered to appear on a front surface. Here, generally, the interface between the film $M_2$ and the film $M_1$ is not always formed to be exactly flat. In this case, for example, when polishing is performed and approaches the interface between the film $M_2$ and the film $M_1$, both a portion where the film $M_2$ remains and a portion where the film $M_1$ is exposed on a front surface appear.

Then, the portion where the film $M_2$ remains is removed, and finally, all surfaces of the film $M_1$ become a target of polishing. Alternatively, even during polishing of the film $M_2$, the sound pressure actual measurement value at that time may be influenced by presence of the film $M_1$ depending on materials configuring the film $M_2$ and the film $M_1$. Thus, the sound pressure actual measurement value obtained between the time $t_2$ and the time $t_4$ can be considered to include a component derived from the polishing of the film $M_2$ and a component derived from the polishing of the film $M_1$.

In other words, a component derived from the polishing of the film $M_2$ is considered to be dominant in the sound pressure actual measurement value obtained between the time $t_0$ and time $t_2$, and in contrast to this, the component derived from polishing of the film $M_2$ and the component derived from polishing of the film $M_1$ are considered to be mixed in the sound pressure actual measurement value obtained between the time $t_2$ and the time $t_4$. In a comparative form, as illustrated in FIG. 5A, the polishing end point is determined based on the amount of change in the sound pressure actual measurement value between the time $t_2$ and the time $t_4$. However, as illustrated in FIG. 5A, the amount of change in the sound pressure actual measurement value between the time $t_2$ and the time $t_4$ is relatively small. In this case, for example, it is easily influenced by noise. Further, even when film arrangements are the same as each other, the amount of change in the sound pressure actual measurement value fluctuates. Accordingly, a case can occur in which it is difficult to determine the polishing end point.

Determination of the polishing end point in a state where some of the film $M_2$ remains depends on the type of wafer and the purpose of polishing. For example, it may be determined that the polishing end point is reached in a state where the film $M_2$ slightly remains without completely removing the film $M_2$.

FIG. 5B is a schematic diagram illustrating a method of determining a polishing end point of a film in the semiconductor manufacturing apparatus according to at least one embodiment. The semiconductor manufacturing apparatus according to at least one embodiment generates a regression model by using, for example, a sound pressure actual measurement value of a polishing sound measured before reaching a predetermined time zone (time zone between $t_2$ and $t_4$) including the time $t_3$ which is a theoretical polishing end point. More specifically, a regression model is generated by using a sound pressure actual measurement value of a polishing sound measured between the time $t_0$ and the time $t_2$. Then, for the time subsequent to $t_2$, a sound pressure prediction value illustrated by a dotted line is calculated by using the generated regression model. That is, in at least one embodiment, the polishing end point is determined by using the regression model generated in a time domain in which a component derived from polishing of the film $M_2$ is considered to be dominant. In other words, in the regression model according to at least one embodiment, influence of the component derived from polishing of the film $M_1$ is excluded or reduced. Alternatively, in the regression model according to at least one embodiment, influence of a film interface between the film $M_2$ and the film $M_1$ can be considered to be excluded or reduced.

In addition, the sound pressure actual measurement value of the polishing sound measured between the time $t_0$ and the time $t_1$ earlier than the time $t_2$ may be used. By generating a regression model based on the sound pressure actual measurement values obtained before the time $t_1$, in the regression model, influence of the component derived from the polishing of the film $M_1$ can be excluded or reduced more reliably.

The time $t_1$ may be set to satisfy, for example, $0.3 \leq (t_1-t_0)/(t_3-t_0) \leq 0.7$. In this case, influence of a component derived from polishing of the film $M_1$ can be excluded or reduced more reliably. Further, after generation of a regression model starts, a larger time margin up to the time $t_3$ can be achieved, and thus, it is possible to achieve more reliable time necessary for processing by, for example, the sound pressure prediction value calculation unit 54 or the like. The time $t_1$ may be changed as appropriate. For example, when it is necessary to more reliably exclude or reduce influence of the component derived from the polishing of the film $M_1$, the time $t_1$ may be set to satisfy $(t_1-t_0)/(t_3-t_0) < 0.3$, or when it is necessary to collect more data used to generated a regression model, the time $t_1$ may be set to satisfy $0.7 < (t_1-t_0)/(t_3-t_0)$.

The semiconductor manufacturing apparatus according to at least one embodiment generates a regression model in which influence of a film interface between the film $M_2$ and the film $M_1$ is excluded or reduced at a time zone earlier than a predetermined time zone (between the time $t_2$ and the time $t_4$) corresponding to a predetermined region where the sound pressure actual measurement value starts to be influenced by the film interface between the film $M_2$ and the film $M_1$, and determines a polishing end point by evaluating a residual difference between the regression model and the sound pressure actual measurement value in a predetermined time zone (between time $t_2$ and time $t_4$). That is, in at least one embodiment, a polishing end point is determined by generating a regression model in which influence of a film interface is excluded or reduced and by evaluating a state of deviation between a sound pressure prediction value and a sound pressure actual measurement value which are calculated from the regression model, instead of evaluating the sound pressure actual measurement value by modeling the film interface itself.

FIG. 5C illustrates a graph in which a square of a residual difference which is a difference between the sound pressure actual measurement value and the sound pressure prediction value illustrated in FIG. 5B is plotted against the polishing time. For example, when the square of the residual difference is a maximum value (local maximum) at time $t_3$, it can be determined that a polishing endpoint is reached at time $t_3$.

In the semiconductor manufacturing apparatus according to at least one embodiment, as illustrated in FIG. 5C, the polishing end point is determined based on, for example, the amount of change in a square of a residual difference between the sound pressure actual measurement value and the sound pressure prediction value using a regression model. Thus, the polishing end point can be determined in a state where an SN ratio is higher than an SN ratio of the comparative example illustrated in FIG. 5A.

Here, the polishing end point is determined by calculating the square of the residual difference. However, for example, the polishing end point may be determined by using differentiation of the residual difference, and a reference method of the residual difference in determining the polishing end point is not limited in particular.

For example, when determining a polishing end point of the film M formed on a wafer, the sound pressure prediction value calculation unit 54 may calculate a sound pressure prediction value by using the above-described regression model and the coefficient each time the sound measuring unit 8 measures a polishing sound. Further, the residual difference calculation unit 55 may calculate a residual difference each time the sound pressure prediction value calculation unit 54 calculates the above-described sound pressure prediction value. Furthermore, the end point determination unit 56 may determine the polishing end point each time the residual difference calculation unit calculates the above-described residual difference. In other words, determination of the polishing end point of the film M may be made in real time while polishing the film M.

Further, for example, the sound pressure prediction regression model generation unit 53 may determine a preferable coefficient for predicting the calculated sound pressure data for a plurality of regression models. Referring to the graph illustrated in FIG. 5B as an example, the sound pressure prediction regression model generation unit 53 may generate, for example, two regression models by using a sound pressure actual measurement value of a polishing sound measured between the time $t_2$ and the time $t_0$. In this case, the sound pressure prediction value calculation unit 54 calculates a sound pressure prediction value to be predicted from each of, for example, the two regression models described above. Further, the residual difference calculation unit calculates each residual difference by using, for example, the sound pressure prediction value predicted from each regression model. Then, the end point determination unit 56 determines the polishing end point by using, for example, each of the above-described residual difference after any one of the two regression models is selected. The "two regression models" may be regression models (for example, a regression model using a logistic curve and a regression model using a Gompertz curve) different from each other. Further, the same regression model (for example, a regression model using a Gompertz curve) may have different coefficients. Further, three or more regression models may be applied. Further, the regression model may not be selected by the end point determination unit 56. Furthermore, the polishing end point may be determined by using both regression models without selecting any one of the two regression models.

Next, action effects of the semiconductor manufacturing apparatus and the semiconductor manufacturing method according to at least one embodiment will be described.

In order to accurately determine a polishing end point of a film formed on a wafer, it is considered that a polishing sound of the film is used. However, for example, there is fluctuation in the formed film. Accordingly, there is a possibility that the amount of change in a sound pressure actual measurement value calculated from the polishing sound differs from each other in each wafer. Further, there is a problem that the amount of change in the sound pressure actual measurement value greatly differs depending on polishing conditions such as the amount of dropped slurry S, a rotation speed of the wafer W by the top ring 2, a rotation speed of the turntable 6, and the type and degree of wear of the polishing pad 4.

Therefore, the semiconductor manufacturing apparatus according to at least one embodiment includes the sound measuring unit 8 that measures a polishing sound of a film formed on a wafer, the sound pressure prediction regression model generation unit 53 that generates a regression model for obtaining a sound pressure prediction value, the sound pressure prediction value calculation unit 54 that calculates a sound pressure prediction value by using the regression model, the residual difference calculation unit 55 that calculates a residual difference which is a difference between a sound pressure actual measurement value and a sound pressure prediction value, and the end point determination unit 56 that determines a polishing end point of a film by using the residual difference.

A sound pressure prediction value is calculated by using a regression model, and a residual difference, which is a difference between a sound pressure actual measurement value and a sound pressure prediction value, is calculated to perform determination, thereby being capable of determining a polishing end point after an SN ratio is increased. This is as illustrated in, for example, FIGS. 5A to 5C. Thus, it is possible to provide a semiconductor manufacturing apparatus capable of accurately determining a polishing end point.

Further, the sound pressure prediction regression model generation unit 53 may generate a regression model for each wafer to be polished. Thereby, even when the amount of change in a sound pressure actual measurement value differs greatly due to polishing conditions such as fluctuation of the formed film and a state of a polishing pad, it is possible to cope therewith.

Further, the sound pressure prediction value calculation unit 54 may calculate a sound pressure prediction value by using the above-described regression model and coefficient each time the sound measuring unit 8 measures a polishing sound, the residual difference calculation unit 55 may calculate a residual difference each time the sound pressure prediction value calculation unit 54 performs calculation, and the end point determination unit 56 may determine a polishing end point each time the residual difference calculation unit calculates the residual difference. In other words, determination of a polishing end point of a film may be performed in real time while polishing the film. In this case, the polishing end point of the film can be determined more exactly, and polishing can be controlled more exactly. Further, as described above, generally, an interface between the film $M_2$ and the film $M_1$ is not limited to be formed exactly flat, and thus, determination of a polishing endpoint in a state where some of the film $M_2$ remains depends on the type of wafer and the purpose of polishing. According to the semiconductor manufacturing apparatus of at least one embodiment, the polishing endpoint can be controlled more exactly even in such a case.

Further, the sound pressure prediction regression model generation unit 53 may generate a plurality of regression models for obtaining a sound pressure prediction value, the sound pressure prediction value calculation unit 54 may calculate sound pressure prediction values by using the respective regression models, the residual difference calculation unit 55 may calculate a residual difference by using the respective sound pressure prediction values, and the endpoint determination unit 56 may select one of the plurality of regression models to determine a polishing end point of a film. For example, depending on a film structure, polishing conditions, and so on, it may become clear which regression model is appropriate only after the film is polished to some extent after the film starts to be polished. In this case, it is possible to more flexibly determine the polishing end point by tentatively using the plurality of regression models. For example, it is also possible to determine the polishing end point of the film by using all of the plurality of regression models.

Further, the sound pressure prediction regression model generation unit 53 may generate the regression model by using a sound pressure actual measurement value of a polishing sound measured between time (for example, $t_2$) earlier than a predetermined time zone (time zone between $t_2$ and $t_4$), including the time $t_3$ corresponding to the polishing end point of the film and the time $t_0$ earlier than the time $t_2$. In other words, sound pressure actual measurement values (for example, a time zone between $t_2$ and $t_4$) at and in the vicinity of a film interface may not be used for generating the regression model. In this case, it is possible to determine a polishing end point of the film from a viewpoint of how much the sound pressure actual measurement value deviates from the sound pressure prediction value by the regression model, in the vicinity of a film interface, by using the regression model generated by excluding the film interface and vicinity thereof. Great fluctuation is in a change in a sound pressure at and in the vicinity of the film interface, which makes a stable regression model hard to be generated. A stable regression model can be generated by using sound pressure actual measurement values at portions spaced apart from a film interface and vicinity thereof.

Further, the time $t_1$ may satisfy, for example, $0.3 \leq (t_1-t_0)/(t_3-t_0) \leq 0.7$. In this case, it is possible to further improve a system of the sound pressure prediction value obtained by the regression model by not incorporating information in the vicinity of the polishing end point into the regression model as much as possible.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:
   a sound sensor configured to measure a first polishing sound of a film formed on a wafer;
   a controller configured to:
   generate a first regression model for obtaining a first sound pressure prediction value of the first polishing sound;
   perform a first calculation of the first sound pressure prediction value by using the first regression model;
   perform a second calculation of a first residual difference, the first residual difference being a difference between a first sound pressure actual measurement value of the first polishing sound and the first sound pressure prediction value; and
   determine a polishing end point of the film using the first residual difference;
   wherein the controller is configured to generate the first regression model using the first polishing sound measured between a second time earlier than a predetermined time zone, the predetermined time zone including a first time corresponding to the polishing end point of the film, and a third time earlier than the second time,
   wherein the processor is configured to generate the first regression model using the first polishing sound measured between a fourth time, the fourth time between the second time and the third time, and the third time, and wherein (fourth time−third time)/ (second time−third time)≤0.5.

2. The semiconductor manufacturing apparatus according to claim 1, wherein
   the controller is configured to generate the first regression model for each wafer to be polished.

3. The semiconductor manufacturing apparatus according to claim 1, wherein
   the controller is configured to perform the first calculation each time the sound sensor performs the measurement,
   the controller is configured to perform the second calculation of the first residual difference each time the controller performs the first calculation, and
   the controller is configured to perform the end point determination each time the controller performs the second calculation of the first residual difference.

4. The semiconductor manufacturing apparatus according to claim 1, wherein
   the controller is configured to generate a second regression model for obtaining a second sound pressure prediction value of the first polishing sound of the film formed on the wafer,
   the controller is configured to perform a third calculation of the second sound pressure prediction value using the second regression model,
   the controller is configured to perform a fourth calculation of a second residual difference, the second residual difference being a difference between the first sound pressure actual measurement value of the first polishing sound and the second sound pressure prediction value, and
   the controller is configured to determine the polishing end point of the film using the first residual difference and the second residual difference.

5. The semiconductor manufacturing apparatus according to claim 1, wherein the end point corresponds to a largest magnitude of the first residual difference.

6. The semiconductor manufacturing apparatus according to claim 1, wherein the controller is configured to analyze the first polishing sound using a fast fourier transform.

7. The semiconductor manufacturing apparatus according to claim 1, wherein the first regression model includes a least one of a polynominal, a regression model using a logistic curve, a regression model using a Gompertz curve, or a regression model using an exponential function.

8. The semiconductor manufacturing apparatus according to claim 1, wherein the first regression model includes at least three regression models.

9. The semiconductor manufacturing apparatus according to claim 1, wherein the controller is configured to generate a first regression model for each wafer to be polished.

10. The semiconductor manufacturing apparatus according to claim 1, wherein the polishing end point corresponds to complete removal of the film.

11. The semiconductor manufacturing apparatus according to claim 1, wherein the determination of the polishing end point is based on a square of the first residual difference.

12. A semiconductor manufacturing method comprising:
    measuring a first polishing sound of a film formed on a wafer;
    generating a first regression model for obtaining a first sound pressure prediction value of the first polishing sound;
    performing a first calculation of the first sound pressure prediction value by using the first regression model;
    performing a second calculation of a first residual difference, the first residual difference being a difference between a first sound pressure actual measurement value of the first polishing sound and the first sound pressure prediction value;
    determining a polishing end point of the film using the first residual difference;
    generating the first regression model using the first polishing sound measured between a second time earlier than a predetermined time zone, the predetermined time zone including a first time corresponding to the polishing end point of the film, and a third time earlier than the second time; and generating the first regression model using the first polishing sound measured between a fourth time, the fourth time between the second time and the third time, and the third time, and wherein (fourth time−third time)/(second time−third time)≤0.5.

13. The method according to claim 12, wherein
the first regression model is generated for each wafer to be polished.

14. The method according to claim 12, comprising
performing the first calculation each time the first polishing sound is measured, performing the second calculation of the first residual difference each time the first calculation is performed, and performing the end point determination each time the second calculation of the first residual difference is performed.

15. The method according to claim 12, comprising
generating a second regression model for obtaining a second sound pressure prediction value of the first polishing sound of the film formed on the wafer, performing a third calculation of the second sound pressure prediction value using the second regression model, performing a fourth calculation of a second residual difference, the second residual difference being a difference between the first sound pressure actual measurement value of the first polishing sound and the second sound pressure prediction value, and determining the polishing end point of the film using the first residual difference and the second residual difference.

16. The method according to claim 12, wherein the end point corresponds to a largest magnitude of the first residual difference.

* * * * *